(12) United States Patent
Montenegro et al.

(10) Patent No.: US 11,563,318 B2
(45) Date of Patent: Jan. 24, 2023

(54) LOOP RESTORATION SWITCHING DEVICE

(71) Applicant: S&C Electric Company, Chicago, IL (US)

(72) Inventors: Alejandro Montenegro, Chicago, IL (US); Michael R Maroney, Chicago, IL (US); Nicholas Seng, Chicago, IL (US); Daniel Desmond, Chicago, IL (US); Goran Djogo, Mount Prospect, IL (US); Thomas J Dyer, Minneola, FL (US); Joseph W Milton, Milwaukee, WI (US); Michael Quinlan, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 17/400,398

(22) Filed: Aug. 12, 2021

(65) Prior Publication Data

US 2022/0102960 A1 Mar. 31, 2022

Related U.S. Application Data

(60) Provisional application No. 63/085,441, filed on Sep. 30, 2020.

(51) Int. Cl.
| | |
|---|---|
| *H02H 3/00* | (2006.01) |
| *H02H 7/00* | (2006.01) |
| *H02H 3/06* | (2006.01) |
| *H02J 3/00* | (2006.01) |
| *H02H 7/26* | (2006.01) |

(Continued)

(52) U.S. Cl.
CPC ............ *H02H 3/06* (2013.01); *G01R 31/086* (2013.01); *H01H 33/53* (2013.01); *H01H 33/66* (2013.01); *H02H 1/0007* (2013.01); *H02H 3/042* (2013.01); *H02H 3/063* (2013.01); *H02H 3/08* (2013.01); *H02H 7/04* (2013.01); *H02H 7/26* (2013.01); *H02J 3/0073* (2020.01); *H02J 3/00125* (2020.01); *H02J 13/0004* (2020.01);

(Continued)

(58) Field of Classification Search
CPC .......... H02H 3/06; H02H 7/26; H02J 3/00125
USPC .......................................................... 361/66
See application file for complete search history.

(56) References Cited

U.S. PATENT DOCUMENTS

| | | | | |
|---|---|---|---|---|
| 7,154,722 | B1 * | 12/2006 | Stoupis | H02H 3/06 307/29 |
| 8,334,738 | B2 * | 12/2012 | Smith | H01H 75/04 361/72 |
| 2002/0179571 | A1 * | 12/2002 | Rhein | H01H 33/6662 218/7 |

* cited by examiner

*Primary Examiner* — Jared Fureman
*Assistant Examiner* — Lucy M Thomas

(57) ABSTRACT

A switching device that is part of a transformer in an underground residential power distribution circuit and provides fault isolation and restoration. The switching device includes a transformer interface for coupling the device to the transformer and a connector interface for coupling the device to a connector. The device also includes a vacuum interrupter having a fixed terminal and a movable terminal, where the fixed terminal is electrically coupled to the connector interface and the movable terminal is electrically coupled to the transformer interface. A control rod is coupled to the movable terminal, an actuator assembly is coupled to the control rod and is operable to move the control rod to open and close the vacuum interrupter. A capacitor is electrically coupled to the fixed terminal, and provides an interface for power line communications signals, voltage sensing, help determine power flow direction and help determine the distance to a fault.

18 Claims, 14 Drawing Sheets

(51) Int. Cl.
*H02J 13/00* (2006.01)
*H02H 3/08* (2006.01)
*H02J 50/00* (2016.01)
*H01H 33/53* (2006.01)
*H01H 33/66* (2006.01)
*H02H 1/00* (2006.01)
*H02H 7/04* (2006.01)
*G01R 31/08* (2020.01)
*H02H 3/04* (2006.01)

(52) U.S. Cl.
CPC ...... *H02J 13/00016* (2020.01); *H02J 50/001* (2020.01)

LOOP RESTORATION SWITCHING DEVICE

CROSS-REFERENCE TO RELATED APPLICATION

This application claims the benefit of priority from the U.S. Provisional Application No. 63/085,441, filed on Sep. 30, 2020, the disclosure of which is hereby expressly incorporated herein by reference for all purposes.

BACKGROUND

Field

The present disclosure relates generally to a switching device that provides fault isolation and restoration in a power distribution network and, more particularly, to a switching device that is part of a transformer in an underground residential power distribution network and that provides fault isolation and restoration.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that increases the load on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. Power distribution networks of the type referred to above often include a number of switching devices, breakers, reclosers, interrupters, etc. that control the flow of power throughout the network, and may be used to isolate faults within a faulted section of the network.

As part of their power distribution network, many utility companies employ a number of underground single-phase lateral circuits that feed residential and commercial customers. Often times these circuits are configured in a loop and fed from both ends, where an open location, typically at a transformer, is used in the circuit to isolate the two power sources. Although providing underground power cables protects circuits from faults created by things like storms and vegetation growth, underground cables still may break or otherwise fail as a result of corrosion and other things. For a residential loop circuit of the type referred to above having two power sources, it is usually possible to reconfigure the open location in the circuit so that loads that are affected by a fault are fed by the other source and service to all of the loads is maintained. However, known processes for identifying the location of a cable failure and the subsequent reconfiguration of the open location often results in long power restoration times.

SUMMARY

The following discussion discloses and describes a switching device that is part of a transformer in an underground residential power distribution circuit and that provides fault isolation and restoration. The switching device includes an outer housing, a transformer interface for coupling the device to the transformer and a connector interface for coupling the device to a connector. The device also includes a vacuum interrupter having a fixed terminal and a movable terminal, where, in one non-limiting embodiment, the fixed terminal is electrically coupled to the connector interface and the movable terminal is electrically coupled to the transformer interface. A control rod is coupled to the movable terminal, an actuator assembly is coupled to the control rod and is operable to move the control rod to open and close the vacuum interrupter. At least one capacitor is electrically coupled to the fixed terminal, where the capacitor provides a voltage for power line communications signals, provides a voltage for voltage sensing, provides a voltage to help determine power flow direction and provides a voltage to help determine the distance to a fault.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a switching device that provides fault isolation and restoration is merely exemplary in nature, and is in no way intended to limit the invention or its applications or uses. For example, the switching devices discussed herein have particular application for use with transformers employed in underground residential circuits. However, the switching devices may have other applications.

This disclosure proposes hardware and algorithms for the automatic protection, isolation and restoration of underground residential cable loops and methods to switch cable segments without handling cable elbows. The system and method provide automation without communications to a central controller, automation without having to configure device parameters, such as IP addresses, even when the automation requires communications between devices, provides coordinated protection through communications-less coordination with a recloser, provides for elimination of load switching and fault making with cable elbows, and controls packaging that can be replaced and upgraded in the field as new features become available.

Figure 1:
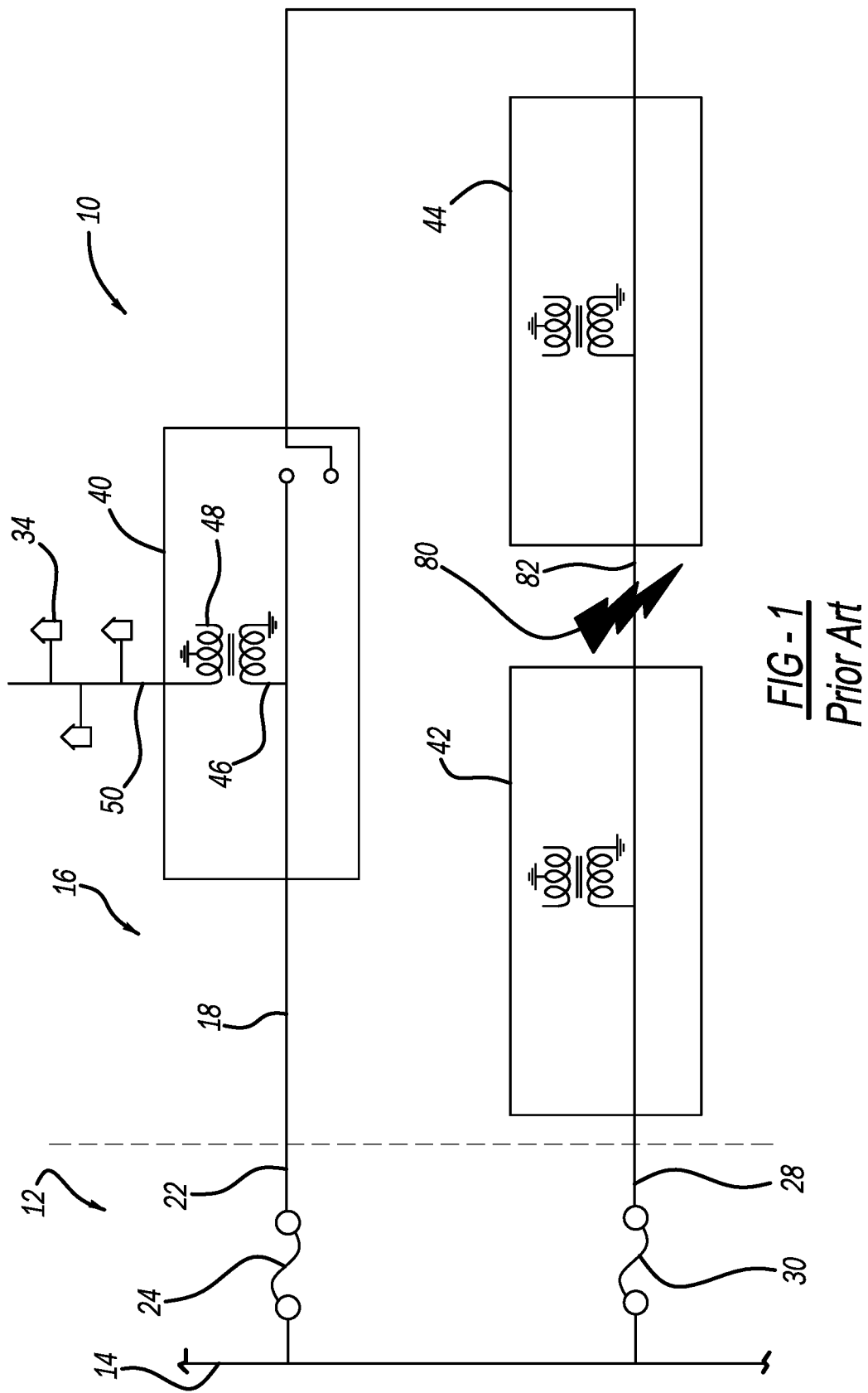
FIG. 1 is a simplified schematic diagram of a known power distribution network including an underground residential power circuit.

FIG. 1 is a simplified schematic diagram of a known power distribution network 10 including an over-head section 12 having a three-phase feeder 14, or possibly a single-phase feeder, and a single-phase underground residential loop section 16 including a single-phase lateral line 18 having one end 22 coupled to the feeder 14 through a fuse 24 and an opposite end 28 coupled to the feeder 14 through a fuse 30, where the fuses 24 and 30 may be pole mounted or pad mounted fuses. Although this embodiment shows the ends 22 and 28 connected to the feeder 14, in an alternate embodiment the ends 22 and 28 may be coupled to different feeders. Further, the ends 22 and 28 would generally be coupled to the same phase of the feeder 14. The fuses 24 and 30 can be any suitable switching device for the purposes described herein that disconnects the line 18 from the feeder 14, such as a fault interrupting device or reclosing device. The medium voltage provided on the line 18 is stepped down to a low voltage by a number of transformers suitable to provide power to a number of loads 34, such as homes. In this non-limiting embodiment, the circuit 16 includes three transformers 40, 42 and 44 each including a primary coil 46 across which the medium voltage is applied and a secondary coil 48 that provides low voltage to a service conductor 50 to which the loads 34 are coupled. However, as will be appreciated by those skilled in the art, a typical underground loop circuit of this type will include several more transformers.

Figure 2:
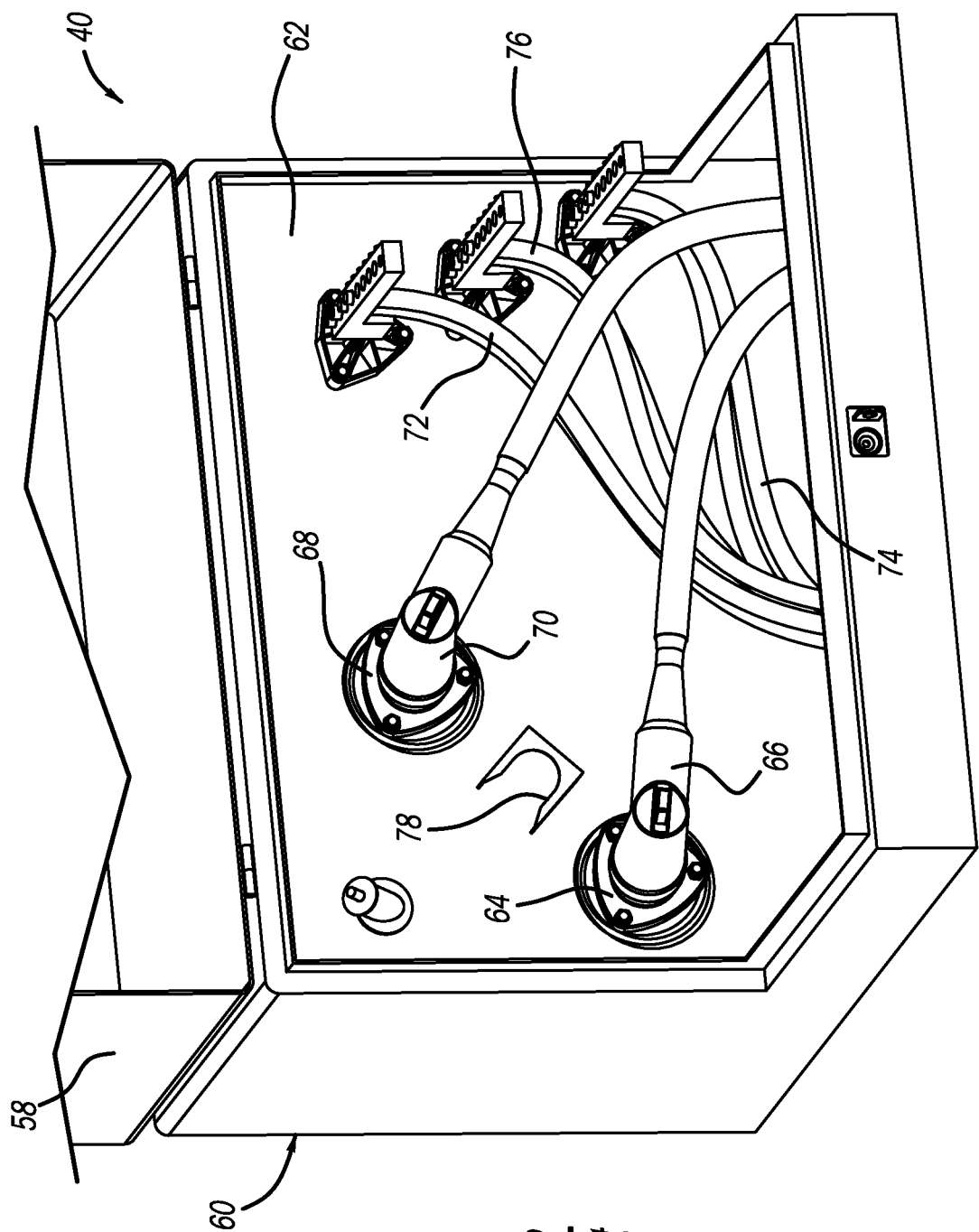
FIG. 2 is an isometric view of a known transformer used in the circuit shown in FIG. 1.

FIG. 2 is an isometric view of the transformer 40 of the type that is mounted on a pad (not shown) with the understanding that the transformers 42 and 44 are the same or similar. The transformer 40 includes an enclosure 60 that houses the coils 46 and 48 and other electrical components (not shown) of the transformer 40. A cover 58 of the enclosure 60 is shown in an open position to expose a panel 62 in the enclosure 60. A connector bushing 64 extends through the panel 62 that accepts an elbow connector 66 that connects the line 18 to the primary coil 46 and a connector bushing 68 extends through the panel 62 that accepts an elbow connector 70 that connects the line 18 to the primary coil 46. A number of positive and negative 120 V lines 72 and 74 and a neutral line 76 are connected to the secondary coil 48, extend from the housing 60 and provide power along the service conductor 50, where the number of the lines 72 and 74 depends on the number and type of the loads 34 being serviced by that transformer. A parking stand 78 is welded to the panel 62 and is a fixture that allows one of the elbow connectors 66 and 70 to be supported when it is detached from the bushing 64 or 68 for reasons that will become apparent from the discussion below.

Power is provided to both ends 22 and 28 of the line 18 and as such one of the elbow connectors is disconnected from one of the transformers 40, 42 or 44 and placed in a bushing (not shown) in the parking stand 78 while it is hot to electrical separate the part of the line 18 that receives power from the end 22 and the part of the line 18 that receives power from the end 28. For example, the right side of the transformer 40 is disconnected from the line 18 so that the loads 34 connected to the transformer 40 receive power from the end 22 of the line 18 and the loads 34 connected to the transformers 42 and 44 receive power from the end 28 of the line 18.

Faults occur even for underground lines from, for example, deterioration of the cable insulation. If a fault 80 occurs, for example, in a section 82 of the line 18 between the transformers 42 and 44, the fuse 30 will operate to clear the fault 80 so that power is prevented from being provided to the loads 34 being serviced by the transformers 42 and 44. The utility will be notified of the fault 80 is some manner, such as an automatic transmission or customer notification, and a procedure is then implemented by the utility that requires workers to manually perform a process for restoring power to the loads 34 serviced by the transformers 42 and 44. For this example, the procedure requires identifying the location of the fault 80 by driving a service truck between the fuse 30 and the transformers 40, 42 and 44, disconnecting the line 18 from the transformers 42 and 44 and closing the fuse 30 to see when the fuse 30 trips and when it does not. Once the location of the fault 80 is identified, then the right side of the transformer 42 is disconnected from the line 18 and placed in the parking stand, the left side of the transformer 44 is disconnected from the line 18 and place in the parking stand and the line 18 is connected to the right side of transformer 40 so that power is provided from the end 22 of the line 18 to the loads 34 serviced by the transformers 40 and 44 and power is provided from the end 28 of the line 18 to the loads 34 serviced by the transformer 42. Such a procedure may take hours to restore power to the loads 34 serviced by the transformers 42 and 44 even assuming everything goes smoothly.

Figure 3:
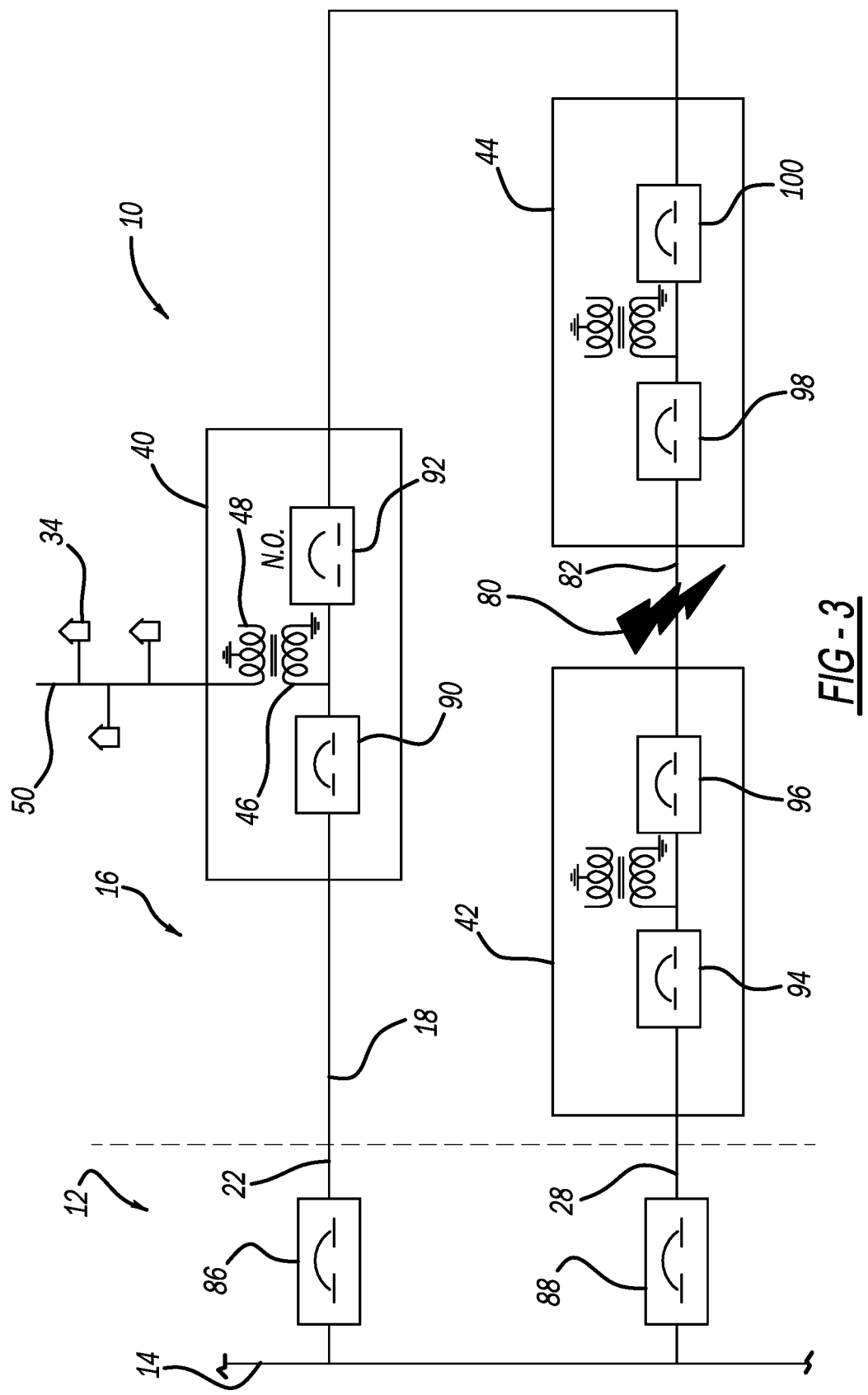
FIG. 3 is a simplified schematic diagram of the power distribution network shown in FIG. 1 where the transformers include a pair of fault interrupting switching devices.

FIG. 3 is a schematic diagram of the network 10 where each transformer 40, 42 and 44 now includes a pair of fault interrupting switching devices that provide automatic power restoration to the loads 34 in response to a fault, as will be described in detail below. Particularly, the transformer 40 includes a fault interrupting switching device 90 coupled between the line 18 and the primary coil 46 and a normally open (NO) fault interrupting switching device 92 coupled between the line 18 and the primary coil 46, the transformer 42 includes a fault interrupting switching device 94 coupled between the line 18 and the primary coil 46 and a fault interrupting switching device 96 coupled between the line 18 and the primary coil 46, and the transformer 44 includes a fault interrupting switching device 98 coupled between the line 18 and the primary coil 46 and a fault interrupting switching device 100 coupled between the line 18 and the primary coil 46. Instead of putting the elbow connector at the right side of the transformer 40 in the parking stand 78, the switching device 92 is opened. Additionally, the fuses 24 and 30 have been replaced with single-phase, self-powered, magnetically actuated reclosers 86 and 88.

Figure 4:
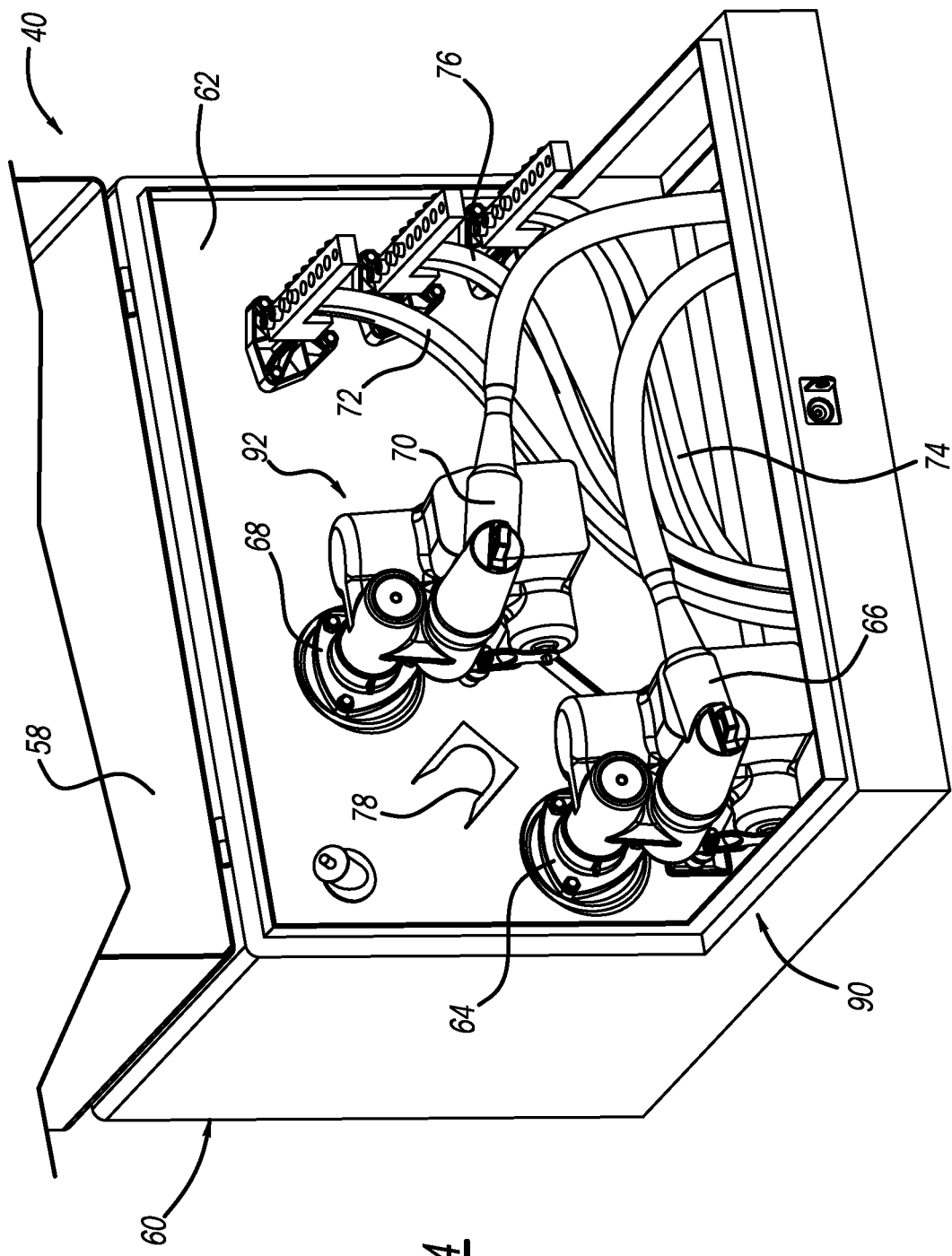
FIG. 4 is an isometric view of the transformer shown in FIG. 2 and including the fault interrupting switching devices.

FIG. 4 is an isometric view of the transformer 40 now shown with the switching devices 90 and 92 in place. Particularly, the switching device 90 is coupled to the bushing 64 and the elbow connector 66 and the switching device 92 is coupled to the bushing 68 and the elbow connector 70.

Figure 5:
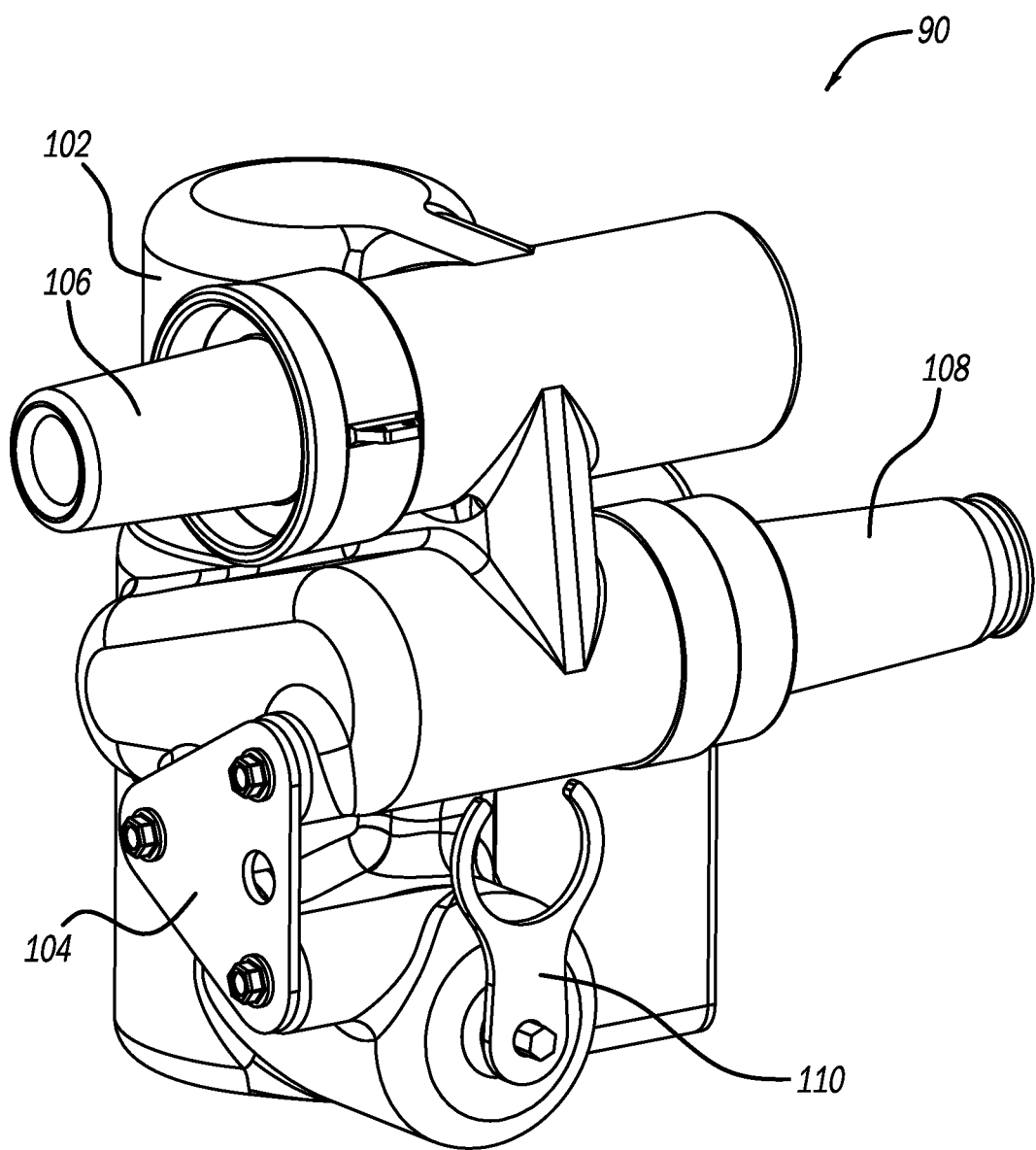
FIG. 5 is an isometric view of one of the fault interrupting switching devices separated from the transformer.
Figure 6:
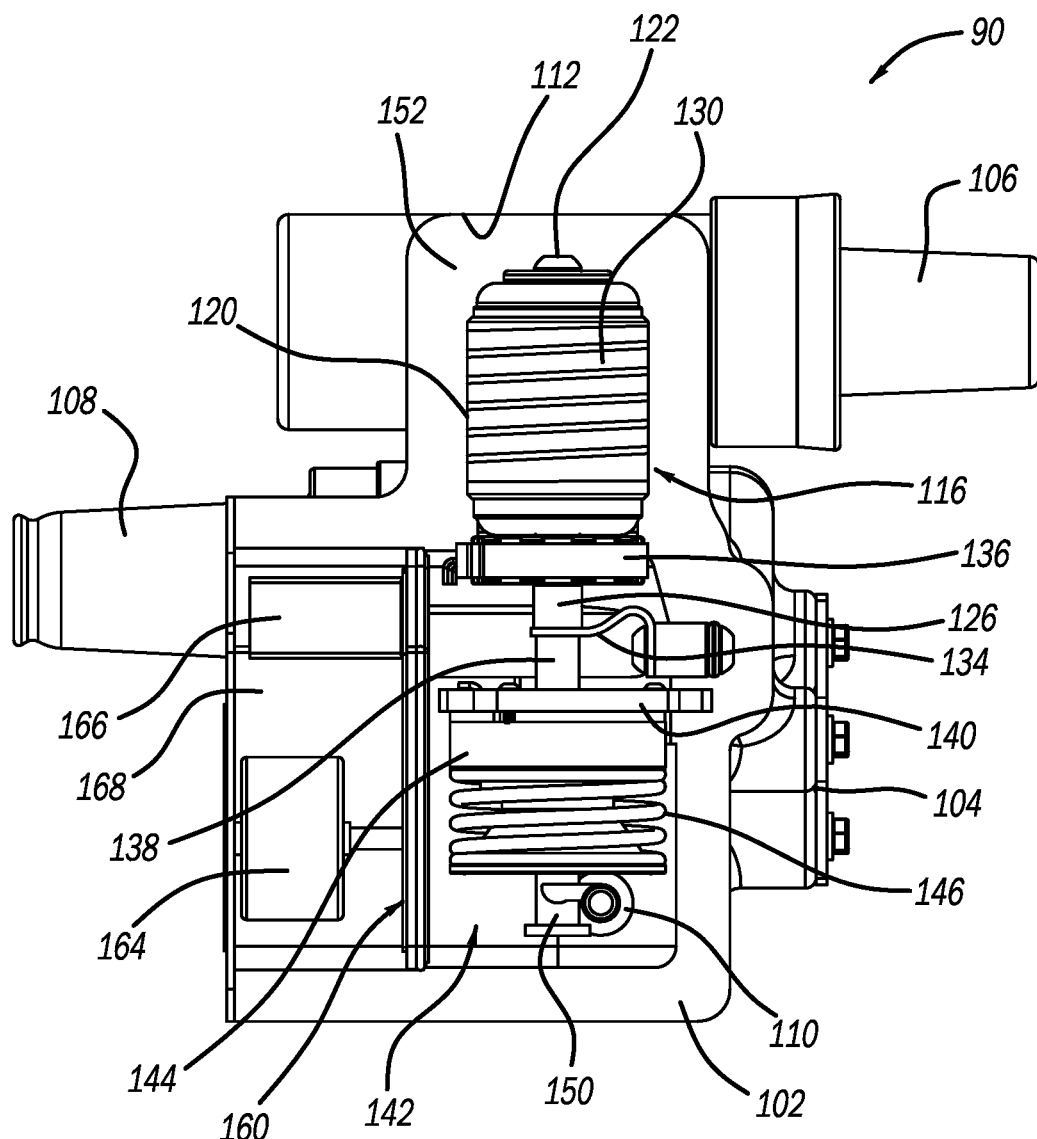
FIG. 6 is a cross-sectional type view of the fault interrupting switching device shown in FIG. 5.

FIG. 5 is an isometric view and FIG. 6 is a cross-sectional view of the switching device 90 separated from the transformer 40. The device 90 includes an outer grounded enclosure 102 having a special configuration to hold the various components therein. A mounting plate 104 is secured to the enclosure 102 and provides an interface to mount the device 90 to the panel 62. A transformer interface 106 extends from the enclosure 102 and is configured to be electrically coupled to the bushing 64 and a load-break connector interface 108 extends from the enclosure 102 and is configured to be electrically coupled to the elbow connector 66. A manual operating handle 110 allows the device 90 to be manually opened and closed, if necessary.

The enclosure 102 defines an internal chamber 112 in which is configured the various components of the device 90. Those components include a vacuum interrupter 116 having a vacuum housing 120 defining a vacuum chamber, a fixed upper terminal 122 extending through a top end of the housing 120 and into the vacuum chamber and a movable lower terminal 126 extending through a bottom end of the housing 120 and into the vacuum chamber, where a bellows (not shown) allows the movable terminal 126 to slide without affecting the vacuum in the vacuum chamber. The upper terminal 122 goes into the page and is connected to the transformer interface 106 and the lower terminal 126 is connected to the load-break interface 108 through a flexible connector 134. A high impedance resistive element 130 is helically wound around the housing 120 and is connected to the upper terminal 122 at one end to provide a current flow for energy harvesting purposes when the vacuum interrupter 116 is open. A Rogowski coil 136 or other current sensor, well known to those skilled in the art, is wrapped around the terminal 126 and measures current flow by means of the voltage that is induced in the coil 136 being proportional to the rate of change of current flow. It is noted that the switching device 90 including the vacuum interrupter 116 can have other designs consistent with the discussion herein.

The movable terminal 126 is coupled to a rod 138 that is coupled to a plate 140, which in turn is coupled to an actuator assembly 142 having an electromagnetic actuator 144 and an opening spring 146, where other compliance springs (not shown) may also be included. The actuator assembly 142 can be any suitable actuator system for the purposes described herein and may, for example, include an armature that is moved by an opening coil to open the vacuum interrupter 116 and is moved by a closing coil to close the vacuum interrupter 116, where the armature and a stator provide a magnetic path for the flux produced by the coils. The coils are de-energized after the actuator 144 is moved to the open or closed position, and permanent magnets (not shown) are used to hold the armature against a latching surface in the open or closed position. The operating handle 110 is connected to a rod 150, which is coupled to the rod 138. When the handle 110 is rotated in the clockwise or counter-clockwise direction, the rod 150 moves up or down to manually open or close the vacuum interrupter 116. The vacuum interrupter 116, the Rogowski coil 136 and the actuator assembly 142 are all at medium voltage potential, and as such are encapsulated in an insulating material 152, such as an epoxy, that fills most of the chamber 112.

An electronics control board 160 is provided within the chamber 112 and includes various electrical components, such as a microprocessor, etc., where the board 160 is powered through the vacuum interrupter 116 when it is closed and through the high impedance element 130 when the vacuum interrupter 116 is open. More particularly, current flows through the lower impedance vacuum interrupter 116 when it is closed and not through the element 130, but flows through the element 130 when the vacuum interrupter 116 is open. Current flow through the element 130 provides power to operate the electronics on the board 160 and operate the actuator assembly 142 to close the vacuum interrupter 116. A high voltage capacitor 164 and an energy storage capacitor 166 are electrically coupled to the board 160. One side of the capacitor 164 is coupled to the board 160 at high voltage and the opposite side of the capacitor 164 is coupled to the grounded enclosure 100, which provides a constant impedance and current that allows voltage measurements. When the vacuum interrupter 116 is closed the capacitor 164 provides a constant current that is used to power the board 160, operate the actuator 144 and charge the storage capacitor 166. When the vacuum interrupter 116 is open and current is flowing through the element 130 if it is available the capacitor 164 also provides a constant current that is used to power the board 160, operate the actuator 144 and charge the storage capacitor 166. The energy stored in the storage capacitor 166 can be used when the vacuum interrupter 116 is open or closed depending on what power is available through the vacuum interrupter 116 or the element 130. A dielectric material 168 that takes the shape of its container and sets, such as epoxy, potting, silicone foam or gel, etc., is provided in the chamber 110 to electrically isolate the high voltage on the electronics board 160 with the grounded enclosure 100. Because the vacuum interrupter 116, the actuator assembly 112 and the control board 160 all operate at the line voltage and thus have a floating reference potential, the device 90 can be made smaller than otherwise would be possible since these components do not need to be electrically isolated.

If the fault 80 occurs in the section 82 of the line 18 between the transformers 42 and 44, the devices 94 and 96 detect overcurrent and will open and interrupt the flow of current. The devices 98 and 100 will see loss of voltage, will not detect overcurrent and will open. A fault hunting algorithm is then performed to isolate the fault and restore power to the loads 34, as described below. The device 94 will detect voltage on its source side, but no voltage on its downstream side and will close after a period of time, and since it does not detect fault current will remain closed. At about the same time, the device 92 will detect voltage on its primary source side, but no voltage on its alternate source side and will close, and since it does not detect fault current will remain closed. When the device 94 closes, the device 96 will detect voltage on its upstream source side and no voltage on its downstream side and will close, but will detect fault current, and will immediately open within, for example, one current cycle time. At the same time, when the device 92 closes, the device 100 will detect voltage on its downstream side, but no voltage on its upstream side and will close, and since it does not detect fault current will remain closed. When the device 100 closes, the device 98 will detect voltage on its upstream source side and no voltage on its downstream side and will close, but will detect fault current, and will immediately open. Thus, the fault 80 is isolated between the devices 96 and 98 and power is restored to all of the loads 34, where the process will take less than a minute.

Fault interrupting switching devices of the type just described can be complex devices that measure voltage, which requires a reference potential. A utility may want to employ less expensive or less sophisticated switching devices, such has sectionalizers, that do not provide fault interrupting and may not include voltage sensors and can only measure current. A sectionalizer is generally a self-contained, circuit-opening device used in combination with source-side protective devices, such as reclosers or circuit breakers, to automatically isolate faulted sections of an electrical distribution network. Sectionalizers are typically distributed between and among the reclosers to provide a system for isolating smaller sections of the network in response to a fault. Sectionalizers rely on observing a sequence of fault currents and/or the presence and absence of voltage either to indicate the presence of a fault or count the number of reclosing attempts, and then perform circuit isolation sectionalizing when the maximum number of reclosing attempts has been reached. Existing power distribution circuit sectionalizers detect the passage of fault currents, including both the initial fault event and subsequent recloser-initiated events, as part of more elaborate fault isolation and restoration processes. These processes may include counting discrete intervals of fault current passage, or counting discrete intervals of voltage presence and absence. In the cases where the particular device is not able to measure voltage, the fault location and isolation schemes discussed above can be augmented using a revised fault location and isolation scheme proposed below.

For the fault interrupting switching devices discussed above, each of the devices included its own electronics board that operated at a floating potential relative to the line voltage. In an alternate embodiment, the electronics are removed from the devices and provided as a single electronics unit for both of the devices in each of the transformers 40, 42 and 44, where the electronics unit operates at ground potential. In this embodiment, the devices can operate as fault interrupting devices or sectionalizers. As used herein, sectionalizers detect overcurrent, but do not provide reclosing, increase a count each time they detect loss of voltage during a fault clearing operation, and lock open if their count has reached a predetermined value and no current is flowing through the device in response to receiving a message. Capacitors are used for voltage sensing and power line communications.

Figure 7:
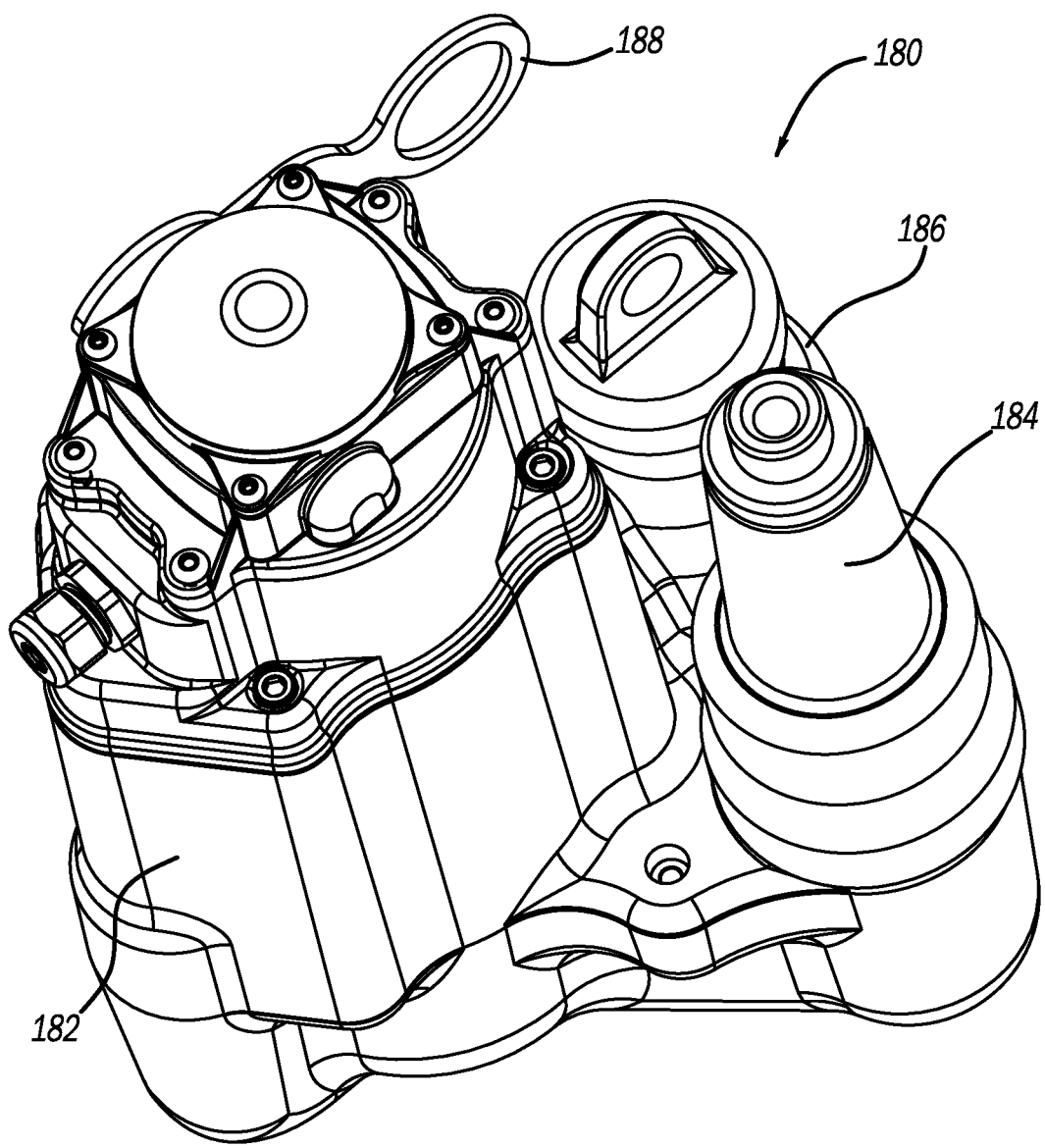
FIG. 7 is an isometric view of a sectionalizer switching device that can be employed in the transformer instead of the fault interrupting switching devices.
Figure 8:
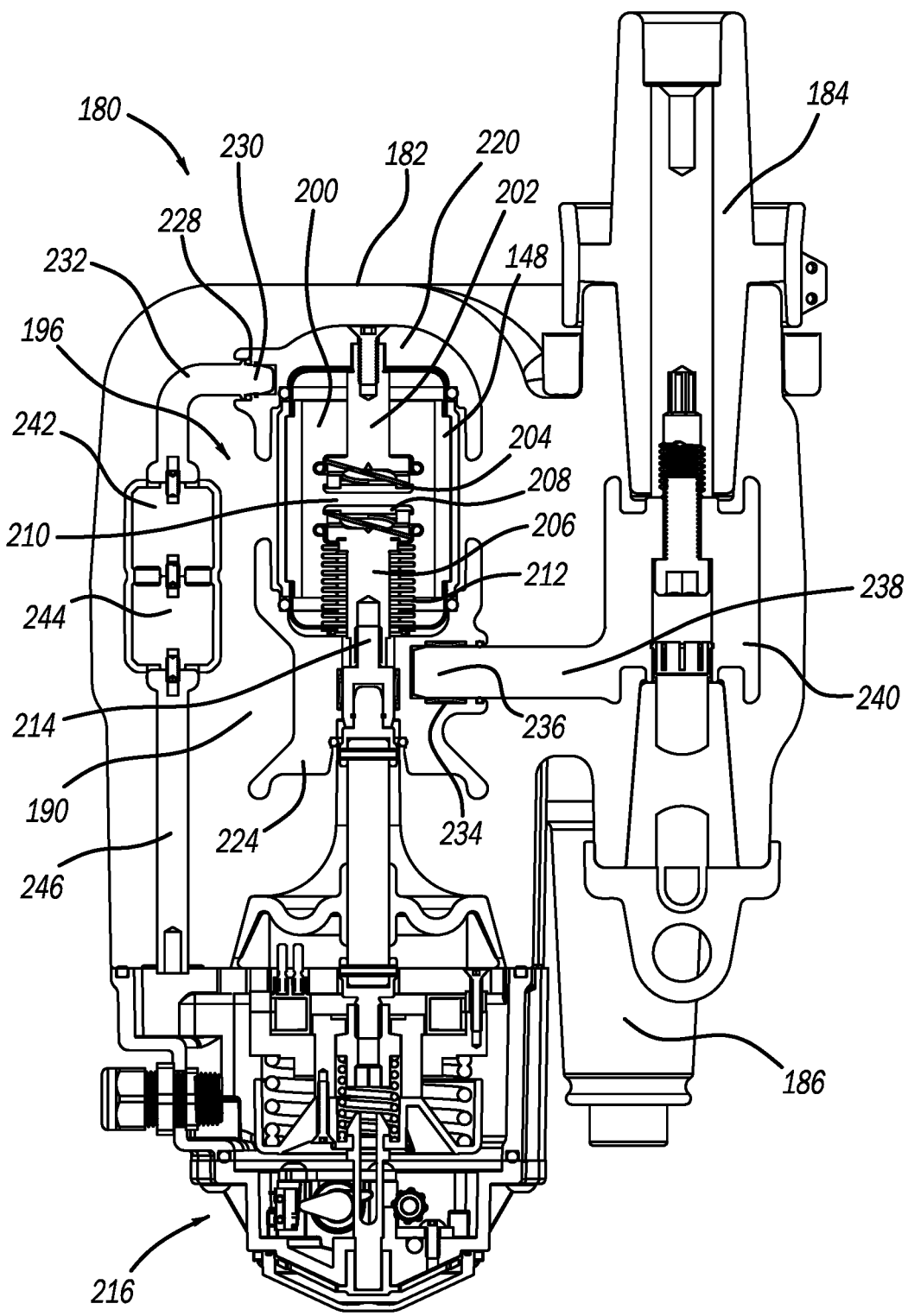
FIG. 8 is a cross-sectional type view of the sectionalizer switching device shown in FIG. 7.
Figure 9:
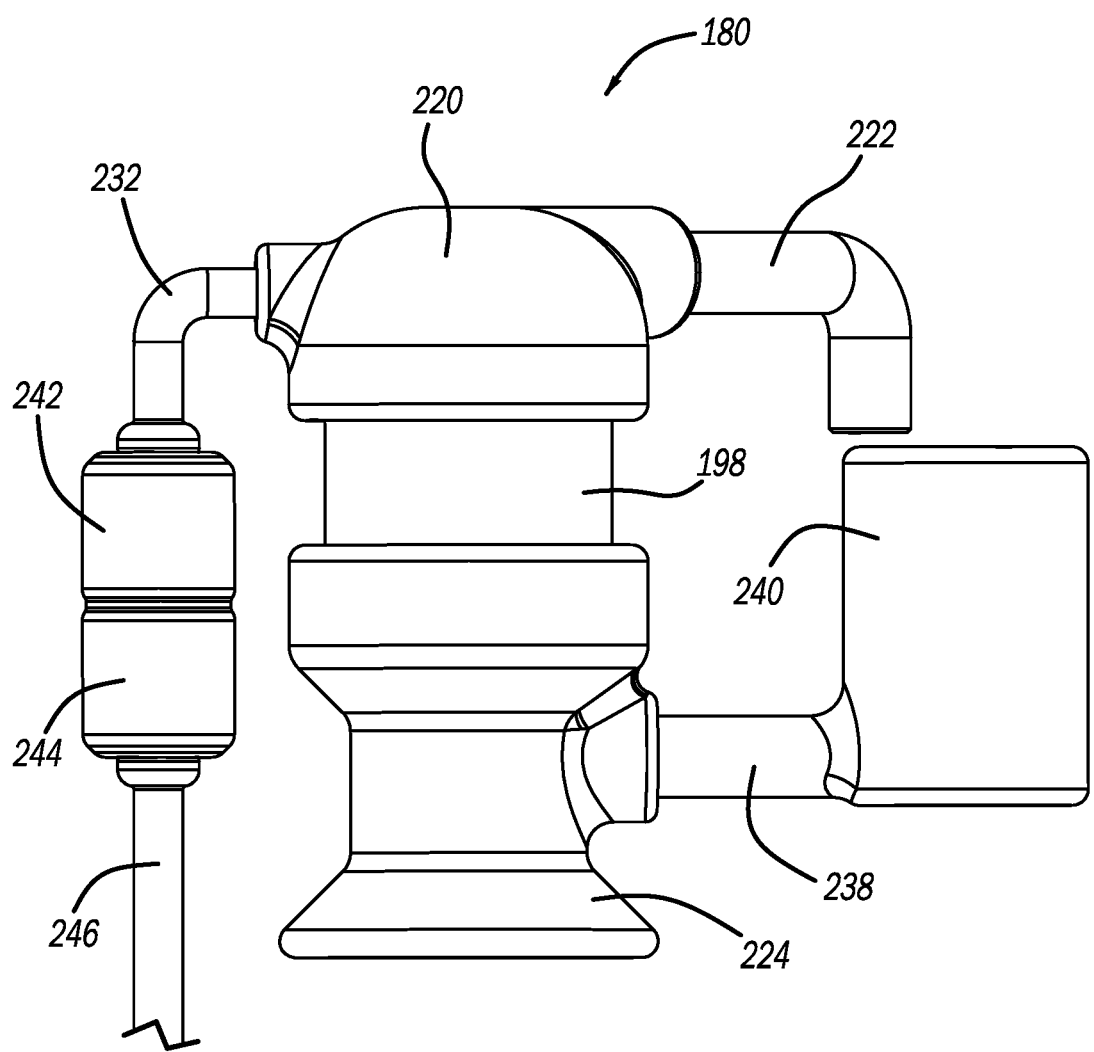
FIG. 9 is a side view of the sectionalizer switching device shown in FIG. 7 illustrating conductors in the device.

FIG. 7 is an isometric view and FIG. 8 is a cross-sectional view of a switching device 180 that can be configured to provide both fault interrupting and sectionalizing, where sectionalizing for this discussion is similar to the traditional sectionalizer with some differences. The device 180 includes an outer enclosure 182, a transformer interface 184, a load-break connector interface 186 and a manual handle 188 configured in a similar manner as the device 90 and operating in a similar manner. The components within the enclosure 182 are encapsulated within an insulating medium 190, such as an epoxy, where many of the components are conductors operating at the medium voltage potential. FIG. 9 is a side view of the switching device 180 with the outer enclosure 182 and the insulating medium 190 removed to show the conductors.

The switching device 180 includes a vacuum interrupter 196 having a vacuum enclosure 198 defining a vacuum chamber 200, an upper fixed terminal 202 extending through the enclosure 198 and into the chamber 200 and having a contact 204 and a lower movable terminal 206 extending through the enclosure 198 and into the chamber 200 and having a contact 208, where a gap 210 is provided between the contacts 204 and 208 when the vacuum interrupter 196 is open. A bellows 212 allows the movable terminal 206 to move without affecting the vacuum integrity of the chamber 200. The movable terminal 206 is coupled to a drive rod 214 that is coupled to an actuator assembly 216 of the type discussed above for opening and closing the vacuum interrupter 196. In this design, the actuator assembly 216 is insulated and not at the line potential. As above, the details of the vacuum interrupter 196 are merely for illustrative purposes in that other designs will be applicable.

A cup-shaped conductor 220 is provided around a top end of the enclosure 198 and is electrically coupled to the fixed terminal 202 and to an elbow conductor 222 that is electrically coupled to the connector interface 186. An hour glass or cylindrical shaped conductor 224 is provided around a bottom end of the enclosure 198 and is electrically coupled to the movable terminal 206. The cup-shaped conductor 220 includes an orifice 228 that accepts an end 230 of an elbow conductor 232 in an electrically coupled slidable engagement so that the elbow conductor 232 can slide relative to the cup-shaped conductor 220 and still maintain electrical contact therewith. The conductor 224 includes an orifice 234 that accepts an end 236 of a rod conductor 238 in an electrically coupled slidable engagement so that the conductor 238 can slide relative to the conductor 224 and still maintain electrical contact therewith, where the conductor 238 is part of a cylindrical transformer conductor 240 that is electrically coupled to the transformer interface 184. The elbow conductor 222 is coupled to the cup-shaped conductor 220 in the same manner. Therefore, when the conductors 220, 222, 224, 232 and 238 are placed in a mold (not shown) and heated insulating material is injected around them, the conductors 220, 222, 224, 232 and 238 are able to slide relative to each other as the insulating material cools and shrinks without affecting the electrical connections.

The elbow conductor 232 is also electrically coupled to one end of a pair of capacitors 242 and 244 and a conductor 246 is electrically coupled to an opposite end of the capacitors 242 and 244, where the end of the capacitors coupled to the elbow conductor 232 is at line potential and the end of the capacitors 242 and 244 coupled to the conductor 246 is at or near ground potential, and thus provide stable voltage coupling for power line communications signals, provide voltage coupling for voltage sensing, help determine power flow direction and help determine the distance to a fault.

Figure 10:
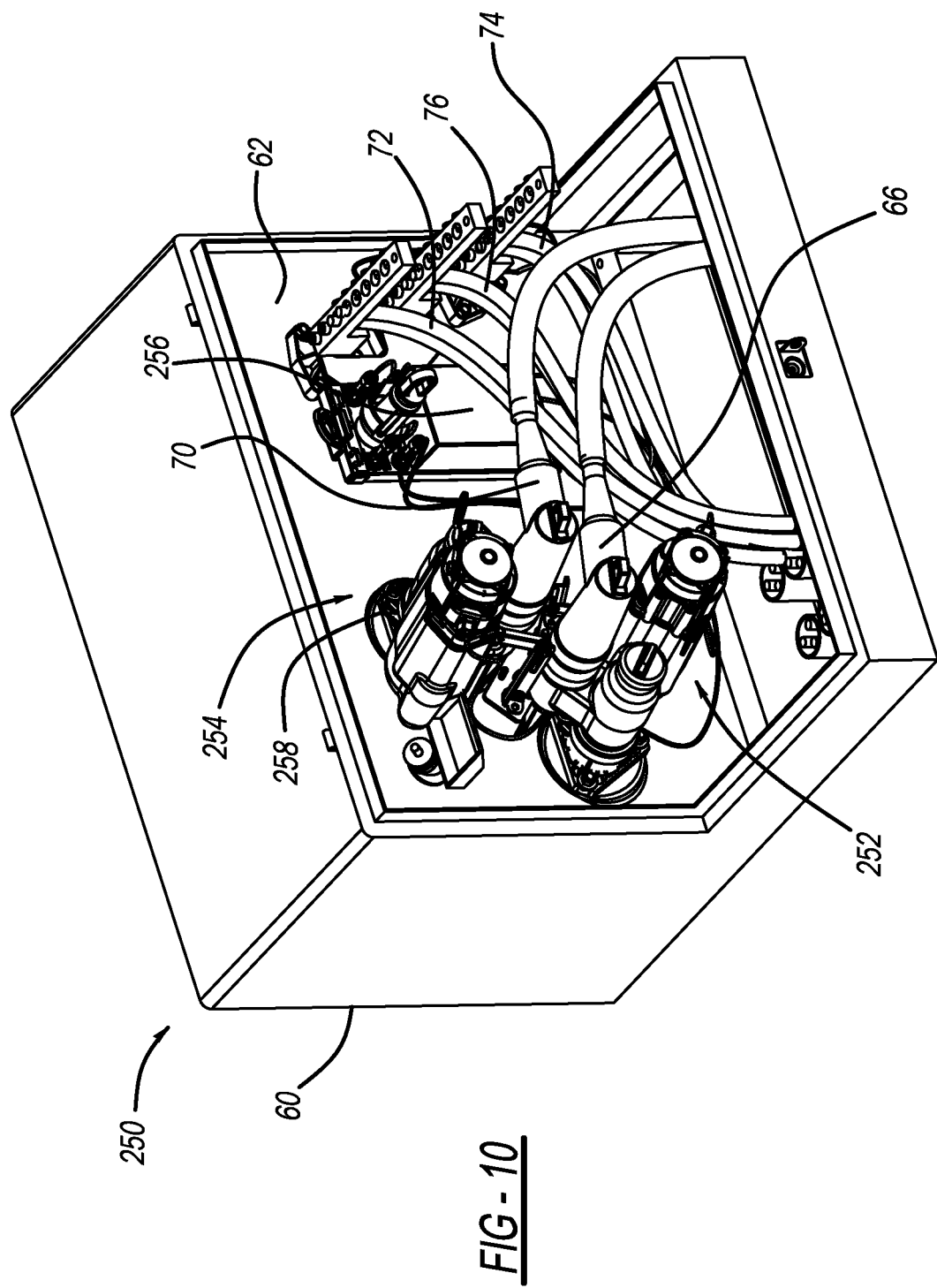
FIG. 10 is an isometric view of the transformer shown in FIG. 2 including two of the sectionalizer switching devices shown in FIGS. 7-9.

FIG. 10 is an isometric view of a transformer 250 that is similar to the transformer 40 except that the switching devices 90 and 92 have been replaced with switching devices 252 and 254 that are identical and are the same as or similar to the device 180, where like elements are identified by the same reference number. The conductors in both of the devices 252 and 254 are connected to a common control unit 256 that controls both of the devices 252 and 254, where the control unit 256 is mounted to the panel 62.

In this embodiment, the control unit 256 is powered by 120 V ac from the lines 72 and 74 through lines 258.

Figure 11:
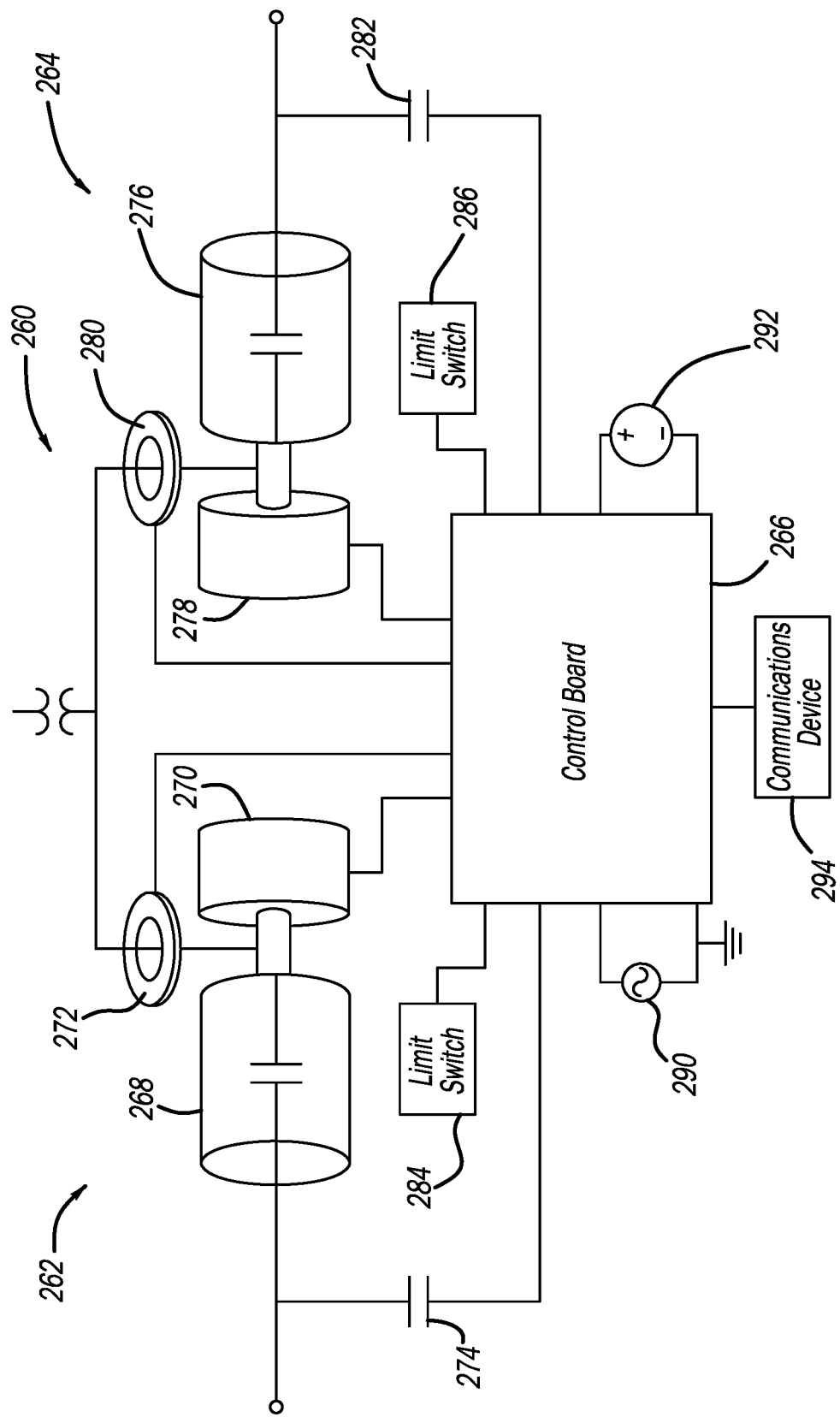
FIG. 11 is a schematic block diagram of a switch assembly including two of the sectionalizer switching devices sharing a common control board.

FIG. 11 is a schematic block diagram of a switch assembly 260 including a switch circuit 262 representing the switching device 252, a switch circuit 264 representing the switching device 254 and a control board 266 representing the control unit 256. The circuit 262 includes a vacuum interrupter 268, an actuator 270, a Rogowski coil 272 and a capacitor 274 and the circuit 264 includes a vacuum interrupter 276, an actuator 278, a Rogowski coil 280 and a capacitor 282 operating as discussed above. The circuit 262 includes a limit switch 284 and the circuit 264 includes a limit switch 286 that tell the control board 266 which position the device 188 on each of the devices 258 and 252 currently holds. Voltage sensing is accomplished by the coupling capacitors 274 and 282 that provide a constant current to a resistor (not shown) in the control board 266 and the voltage is measured across the resistor. The control board 266 is powered by a 120 Vac source 290 from the secondary coil 48 and a 9V dc battery 292, and may provide signals to a communications device 294, such as a utility radio.

Figure 12:
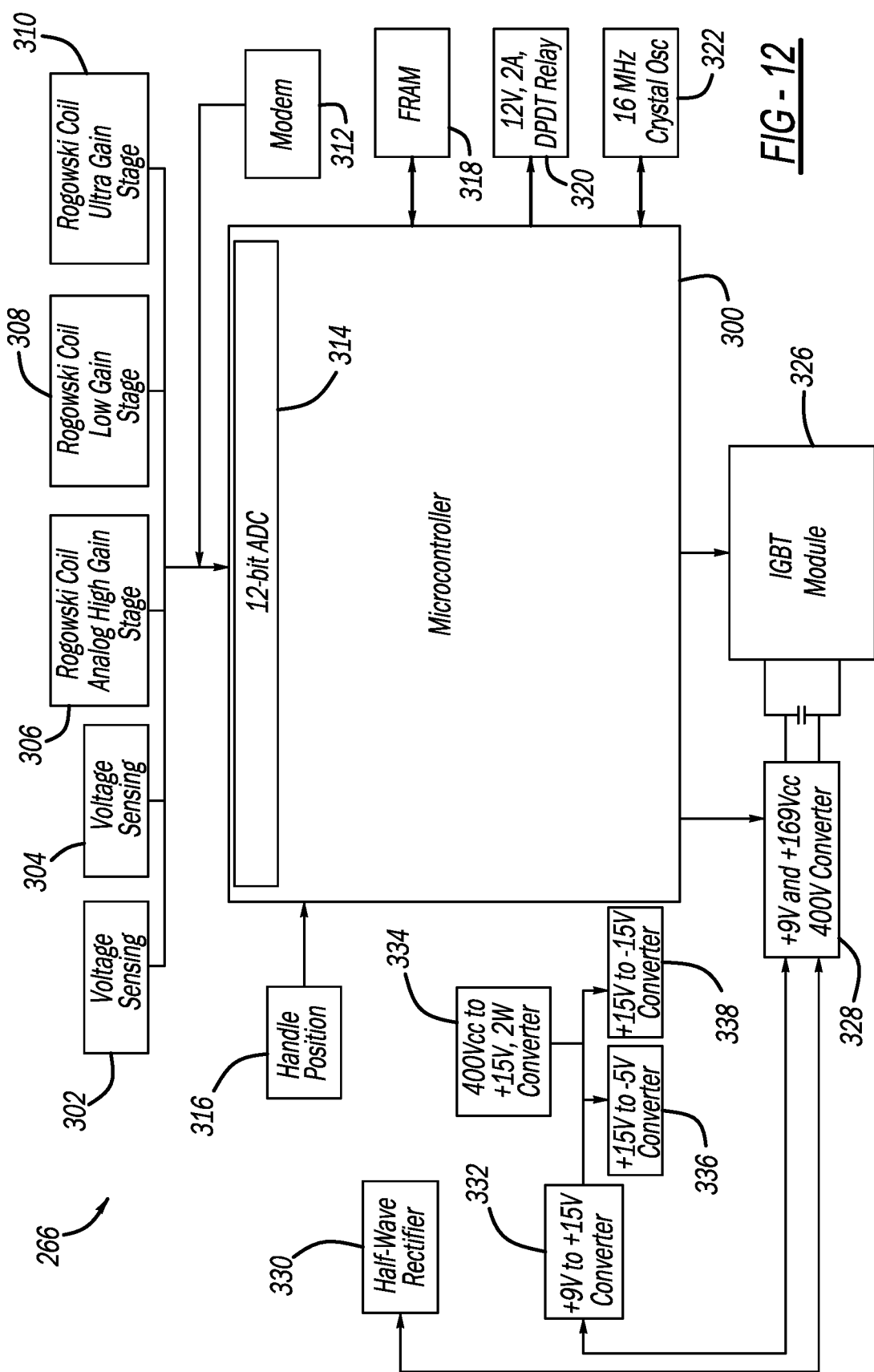
FIG. 12 is a schematic block diagram of the control board in the switch assembly.

The control board 266 can be configured with any suitable components and software that perform any desired function consistent with the discussion herein. FIG. 12 is a schematic diagram of the control board 266 showing one non-limiting example. The control board 266 includes a microcontroller 300 that receives the various inputs, performs the various algorithms and provides the various outputs. Signals are received from and provided to various elements with respect to the microcontroller 300. These elements include measured voltages for both of the switching circuits 262 and 264 at boxes 302 and 304, respectively, high gain at box 306 for the Rogowski coils 274 and 280, low gain at box 308 for the Rogowski coils 274 and 280, ultra-gain at box 310 for the Rogowski coils 274 and 280, and a modem 312 that provide signals to an analog-to-digital (ADC) converter 314. Further, the elements include handle position at box 316 that links up with the limit switches 284 and 286, a ferroelectric random access memory (FRAM) 318, a relay 320 and a crystal oscillator 322. The elements further include an insulated gate bipolar transistor (IGBT) module 326, a half-wave rectifier 328 and voltage converters 330, 332, 334, 336 and 338.

Figure 13:
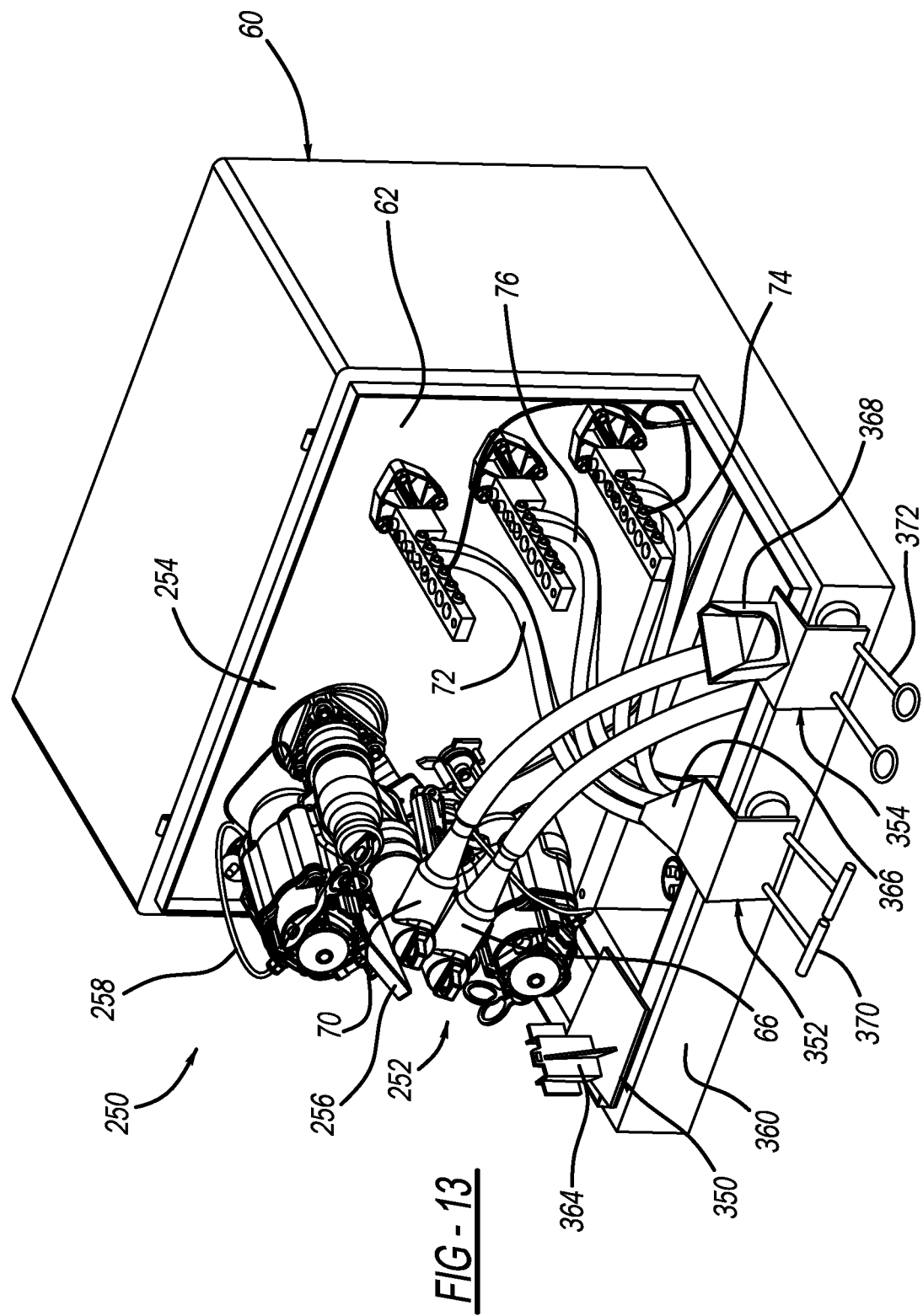
FIG. 13 is an isometric view of the transformer shown in FIG. 10 and including parking stands.

By employing the switching devices in connection with the transformers as discussed above, the known parking stand 78 may be obscured and not usable, i.e., blocked by the control unit 256, which may not be acceptable. FIG. 13 is an isometric view of the transformer 250 including various embodiments for attaching auxiliary parking stands thereto. Specifically, the transformer 250 includes parking stand units 350, 352 and 354 mounted to an edge 360 of the enclosure 60 to which the cover 58 is secured. The unit 350 includes a mount 364, the unit 352 includes a mount 366 and the unity 354 includes a mount 368 that are configured to receive the elbow connector 66 or 70 when it is detached from the load-break connector interface 186. Thus, when the cover 58 is lifted, the technician can secure one or more of the units 350, 352 and 354 to the edge 360 using, for example, securing mechanisms 370 or 372.

Figure 14:
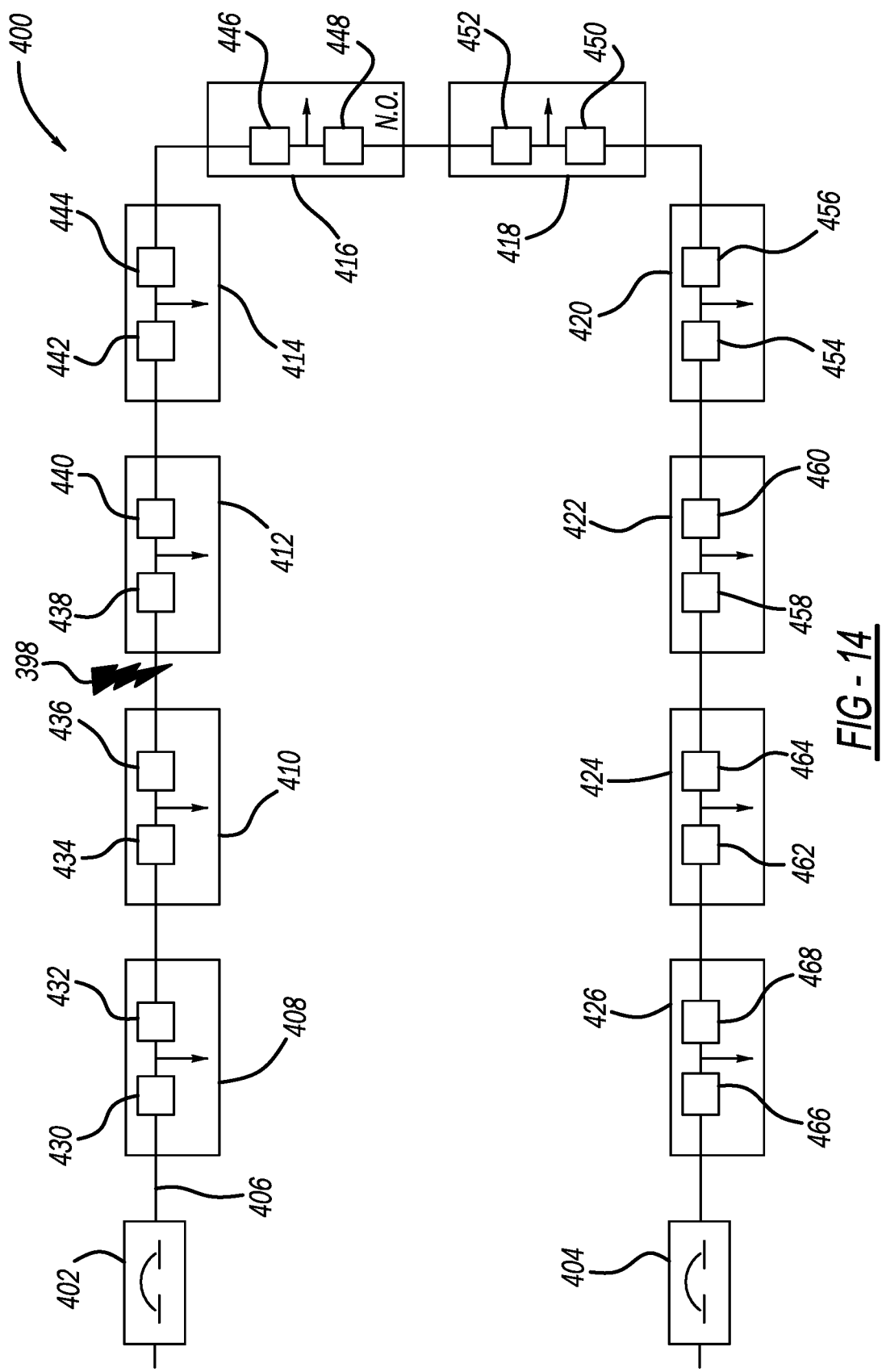
FIG. 14 is a simplified schematic diagram of a residential power distribution network of the type including transformers having a pair of switching devices that are either fault interrupting devices or sectionalizer devices, where the network is used to describe fault isolation and power restoration for situations where a fault occurs in the network or there is a loss of voltage upstream of the network.

FIG. 14 is a simplified schematic diagram of a residential power distribution network 400 similar to the network 10. The network 400 includes two single-phase, self-powered, magnetically actuated reclosers 402 and 404 connected to the same or different feeders (not shown), i.e., at a head end of the network 400, an underground distribution line 406 and ten transformers 408, 410, 412, 414, 416, 418, 420, 422, 424 and 426 coupled along the line 406 in the manner discussed above. The transformer 408 includes switching devices 430 and 432, the transformer 410 includes switching devices 434 and 436, the transformer 412 includes switching devices 438 and 440, the transformer 414 includes switching devices 442 and 444, the transformer 416 includes switching devices 446 and 448, the transformer 418 includes switching devices 450 and 452, the transformer 420 includes switching devices 454 and 456, the transformer 422 includes switching devices 458 and 460, the transformer 424 includes switching devices 462 and 464, and the transformer 426 includes switching devices 466 and 468. The switching device 448 is normally open to provide electrical isolation between the source ends of the network 400.

The network 400 will be used below to describe fault isolation and power restoration processes when a fault 398 occurs in the line 406 between the transformers 410 and 412 or there is a loss of voltage upstream of the network 400, where each of the switching devices 430-466 is similar to the switching device 180 and operate as fault interrupting devices or as sectionalizers that do not provide fault interrupting. For the discussion below, any reference to detecting overcurrent, detecting loss of voltage, starting timers, sending messages, etc. in the transformers or the switching devices is performed by the shared control unit 256 for the switching devices in the transformer.

For the fault interrupting embodiment, if the fault 398 occurs in the line 406, the network 400 operates to isolate the fault and restore power as follows. In order for the fault isolation and power restoration to be performed by the network 400 using the fault interrupting switching devices, the reclosers 402 and 404 need to have a minimum 1.5 power frequency cycle recloser trip. When the fault occurs, the recloser 402 will open, the transformers 408 and 410 will log the overcurrent event and in response to detecting loss of voltage a timer will start in the transformer 416, which will eventually be used to open the normally closed device 448. In response to detecting the overcurrent followed by loss of voltage, one fault interrupter in each of the transformers 408 and 410 will open. The recloser 402 will then close in the reclosing operation after 1.5 cycles, and the transformer 408 will detect voltage on the upstream side of the device 432 and it will close. When the device 432 closes, the transformer 410 will detect voltage on the upstream side of the device 434 and it will close. When that happens, the transformer 410 detects overcurrent again due to the fault on the adjacent segment and determines the fault must be on its downstream side, and thus causes the device 436 to lock open to isolate the fault. When the timer in the transformer 416 expires, the normally open switching device 448 is closed and in response to the transformer 416 detecting overcurrent now from the recloser 404 side of the line 406, the normally open switching device 448 will immediately open and clear the fault current, but the recloser 404 will not open because its trip time is 1.5 cycles. The transformers 412 and 414 detect the overcurrent followed by loss of voltage, and thus the now downstream device 438 in the transformer 412 and the now upstream device 444 in the transformer 414 are opened. The normally open switching device 448 is then closed, and the transformer 414 will detect voltage on the upstream side of the device 444 and it will close. When the device 444 closes, the transformer 412 will detect voltage on one side of the device 438 and it will close. When that happens, the transformer 412 detects overcurrent again and determines the fault must be on its downstream side, and thus causes the device 438 to lock open and isolate the fault on the original upstream side. In this scenario, it would be required that a worker reset the original configuration of the network 400 when the fault is fixed using the manual handle 188 on the appropriate switching devices 430-466.

For the loss of voltage scenario upstream of the network 400, the devices 430 and 466 are designated "head end" devices. If loss of voltage occurs upstream of the recloser 402, the transformers 408, 410, 412, 414 and 416 detect the loss of voltage, and a timer is started in the transformer 408 because it has the head end switching device 430 and a timer is started in the transformer 416 because it has the normally open switching device 448, where the timer in the transformer 408 is shorter than the timer in the transformer 416. When the timer in the transformer 408 expires and loss of voltage is still detected, the head end switching device 430 will open to isolate the source at the recloser 402 from the recloser 404, which gives the system time to clear faults upstream of the recloser 402. The timer in the transformer 416 will then expire and the device 448 will close, which will provide power from the recloser 404 to all of the transformers 408-416. In this embodiment, the head end switching device 430 becomes the normally open switching device. In this scenario, it would be required that a worker reset the original configuration of the network 400 when the source voltage returns using the manual handle 188 on the appropriate switching devices 430-466.

For the sectionalizer embodiment, if the fault occurs in the line 406 between the transformers 410 and 412, the network 400 operates to isolate the fault and restore power as follows. In this design, the protection settings in the reclosers 402 and 404 do not need to be modified so that, for example, they have a 1.5 minimum trip cycle time, but can be set in any suitable manner. The recloser 402 detects the overcurrent and opens in a fault clearing process, and the switching devices 430, 432, 434 and 436 detect the overcurrent, but do not have fault interrupting capability, and detect the loss of voltage when the recloser 402 opens. The switching devices 438, 440, 442, 444 and 446 do not detect the overcurrent, but do detect loss of voltage, and thus the transformers 412 and 414 start a timer in response thereto, where the transformer 416 does not start a timer because it has the normally open switching device 448. The recloser 402 then closes as part of the fault clearing process, detects the overcurrent again and opens again. In response to detecting overcurrent and then loss of voltage a second time, the downstream devices 432 and 436 in the transformers 408 and 410, respectively, open, and the transformers 408 and 410 send a power line carrier "clear to close" message on the line 406 to their immediate upstream transformer to close their downstream switching device if they detected overcurrent, and thus the device 432 closes, but the device 436 remains open because the transformer 410 did not receive the clear to close message. The transformer 408 does send the message upstream, but since there is not a switching device upstream to receive the message nothing happens in response thereto. This allows all of the devices 430-466 to be the same without the need to provide any in-field configuration of the devices 430-466 when they are installed. The recloser 402 then operates a third reclosing sequence test, and since the device 436 did not receive the clear to close message and is open, the recloser 402 does not detect overcurrent and remains closed, and power is restored between the recloser 402 and the transformer 410. The recloser 402 will then reset all of its protection timings, which do not need to be coordinated with the devices 430-446.

Subsequently, the timers operating in the transformers 412 and 414 will expire and since they detected loss of voltage, but did not detect overcurrent and did not receive a clear to close message, they know that they are downstream of the fault or a loss of voltage event. In response to this the upstream devices 438 and 442 in the transformers 412 and 414, respectively, will open and the transformers 412 and 414 will send a clear to close message to their immediate downstream transformer that includes a unique communications (com) ID generated at runtime. The device 446 is not opened because the transformer 416 knows that it has the normally open device 448. The transformer 412 did not receive a clear to close message so the device 438 remains open and the fault is isolated between the transformers 410 and 412. The transformer 414 does receive the clear to close message from the transformer 412 so the device 442 is closed, and the transformer 416 receives the clear to close message from the transformer 414, but since it knows that it has the normally open device 448 and the device 446 is still closed, it starts a timer, which allows the system time to make sure the fault is isolated. When the timer in the transformer 416 expires, the device 448 is closed, and power is restored to the transformers 412, 414 and 416 from the recloser 404. The part of the line 406 between the transformers 410 and 412 will then likely be repaired. When workers arrive at the transformers 410 and 412, they will use the manual lever 188 to lock out the devices 436 and 438 and prevent them from opening.

If power is lost upstream of the recloser 402, the transformers 408, 410, 412, 414 and 416 will go through the process discussed above where they do not detect overcurrent, but do detect loss of voltage. When that occurs, the transformers 408, 410, 412, 414 and 416 start timers and when the timer expires, the upstream devices 430, 434, 438 and 442 in the transformers 408, 410, 412 and 414, respectively, open and a clear to close message is sent downstream from the transformer 408 to the transformer 410, from the transformer 410 to the transformer 412, from the transformer 412 to the transformer 414 and from the transformer 414 to the transformer 416, along with a unique comID generated at run time in the message. Each time a transformer receives a comID it resends the comID to its downstream transformer so that all of the com IDs are accumulated in the transformer 416. The messages cause the devices 434, 438 and 442 to close, but the device 430 remains open because it didn't receive a clear to close message and as a result will isolate the network 400. The device 448 does not immediately close because it is subject to the timer in the transformer 416, and when the timer expires it will close and re-energize all of the transformers 408-416 from the recloser 404.

When power is restored to the recloser 402, it is desirable to return the network 400 to its normal state. For the sectionalizer embodiment, when the transformer 408 detects the return of voltage on its upstream side it will transmit a message along with its comID down the line 406 to the transformer 416 to return to the normal state. The comIDs are used to identify the transformers 430-446 as they relay messages from transformer to transformer so that messages are not sent to the transformers 418, 420, 422, 424 and 426 that are not affected by the loss of voltage. The transformer 416 then knows to open the device 448, where power is lost between the transformers 408 and 416, and not to send the message further downstream. The device 430 is then closed to restore power.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A switching device for connecting a power cable to a transformer and controlling power flow therebetween, the switching device comprising:
   an outer housing;
   a transformer interface for coupling the switching device to the transformer;
   a connector interface for coupling the switching device to a connector;
   a vacuum interrupter having a fixed terminal and a movable terminal, the fixed terminal being electrically coupled to the connector interface and the movable terminal being electrically coupled to the transformer interface;
   a control rod coupled to the movable terminal;
   an actuator assembly coupled to the control rod and being operable to move the control rod to open and close the vacuum interrupter;
   at least one capacitor electrically coupled to the fixed terminal, the at least one capacitor providing a voltage for power line communications signals, providing a voltage for voltage sensing, providing a voltage to help determine power flow direction and providing a voltage to help determine the distance to a fault, and
   a first conductor electrically coupled to the fixed terminal, the first conductor including a first orifice, the switching device further comprising a second conductor electrically coupling the connector interface to the first conductor, the second conductor having an end that is slidable inserted into the first orifice.

2. The switching device according to claim 1 wherein the first conductor is cup-shaped and is formed over an end of the vacuum interrupter.

3. The switching device according to claim 1 further comprising a third conductor electrically coupling the first conductor to the at least one capacitor, the first conductor including a second orifice, the third conductor having an end that is slidable inserted into the second orifice.

4. The device according to claim 1 further comprising a first conductor electrically coupled to the movable terminal, the first conductor including an orifice, the device further comprising a second conductor electrically coupling the transformer interface to the first conductor, the second conductor having an end that is slidable inserted into the orifice.

5. The device according to claim 4 wherein the first conductor is cylindrical-shaped and is formed over an end of the vacuum interrupter.

6. The device according to claim 1 wherein the switching device operates as a fault interrupting device.

7. The device according to claim 1 wherein the switching device operates as a sectionalizer.

8. The device according to claim 1 wherein the transformer is part of an underground residential power distribution network.

9. A switching device comprising:
   an outer housing;
   a first interface for coupling the switching device to a first connector;
   a second interface for coupling the switching device to a second connector;
   a vacuum interrupter having a fixed terminal and a movable terminal, the fixed terminal being electrically coupled to the first interface and the movable terminal being electrically coupled to the second interface;
   a control rod coupled to the movable terminal;
   an actuator assembly coupled to the control rod and being operable to move the control rod to open and close the vacuum interrupter;
   at least one capacitor electrically coupled to the fixed terminal, the at least one capacitor providing voltage for power line communications signals, providing a voltage for voltage sensing, providing a voltage to help determine power flow direction and providing a voltage to help determine the distance to a fault; and
   a first conductor electrically coupled to the fixed terminal, the first conductor including a first orifice, the switching device further comprising a second conductor electrically coupling the connector interface to the first conductor, the second conductor having an end that is slidable inserted into the first orifice.

10. The switching device according to claim 9 wherein the first conductor is cup-shaped and is formed over an end of the vacuum interrupter.

11. The switching device according to claim 9 further comprising a third conductor electrically coupling the first conductor to the at least one capacitor, the first conductor including a second orifice and the third conductor having an end that is slidable inserted into the second orifice.

12. The device according to claim 9 further comprising a first conductor electrically coupled to the movable terminal, the first conductor including an orifice, the device further comprising a second conductor electrically coupling the second interface to the first conductor, the second conductor having an end that is slidable inserted into the orifice.

13. The device according to claim 12 wherein the first conductor is cylindrical-shaped and is formed over an end of the vacuum interrupter.

14. The device according to claim 9 wherein the switching device operates as a fault interrupting device.

15. The device according to claim 9 wherein the switching device operates as a sectionalizer.

16. The device according to claim 9 wherein the device is part of a transformer in an underground residential power distribution network.

17. A switching device comprising:
   an outer housing;
   a first interface for coupling the switching device to a first connector;
   a second interface for coupling the switching device to a second connector;
   a vacuum interrupter having a fixed terminal and a movable terminal, the fixed terminal being electrically coupled to the first interface and the movable terminal being electrically coupled to the second interface;
   a first conductor electrically coupled to the fixed terminal, the first conductor including a first orifice;
   a second conductor electrically coupling the first interface to the first conductor, the second conductor having an end that is slidable inserted into the first orifice;
   a third conductor electrically coupling the first conductor to a capacitor, the first conductor including a second orifice and the third conductor having an end that is slidable inserted into the second orifice;
   a fourth conductor electrically coupled to the movable terminal, the fourth conductor including a third orifice;
   a fifth conductor electrically coupling the second interface to the fourth conductor, the fifth conductor having an end that is slidable inserted into the third orifice;
   a control rod coupled to the movable terminal; and an actuator assembly coupled to the control rod and being operable to move the control rod to open and close the vacuum interrupter.

18. The switching device according to claim 17 wherein the first conductor is cup-shaped and is formed over one end of the vacuum interrupter and the fourth conductor is cylindrical-shaped and is formed over an opposite end of the vacuum interrupter.

* * * * *